United States Patent
Tag et al.

(10) Patent No.: US 10,298,202 B2
(45) Date of Patent: May 21, 2019

(54) BAW RESONATOR WITH REDUCED HEAT BUILD-UP, HF FILTER COMPRISING BAW RESONATOR, DUPLEXER COMPRISING HF FILTER, AND PRODUCTION METHOD

(71) Applicant: SNAPTRACK, INC., San Diego, CA (US)

(72) Inventors: Andreas Tag, Munich (DE); Bernhard Bader, Neubiberg (DE); Maximilian Pitschi, Rottach-Egern (DE)

(73) Assignee: SnapTrack, Inc., San Diego, CA (US)

( * ) Notice: Subject to any disclaimer, the term of this patent is extended or adjusted under 35 U.S.C. 154(b) by 52 days.

(21) Appl. No.: 15/528,713

(22) PCT Filed: Nov. 10, 2015

(86) PCT No.: PCT/EP2015/076197
§ 371 (c)(1),
(2) Date: May 22, 2017

(87) PCT Pub. No.: WO2016/083121
PCT Pub. Date: Jun. 2, 2016

(65) Prior Publication Data
US 2017/0272053 A1    Sep. 21, 2017

(30) Foreign Application Priority Data
Nov. 25, 2014    (DE) .................... 10 2014 117 238

(51) Int. Cl.
*H03H 9/15* (2006.01)
*H03H 9/02* (2006.01)
(Continued)

(52) U.S. Cl.
CPC ............. *H03H 9/175* (2013.01); *H01L 41/27* (2013.01); *H03H 9/02102* (2013.01); *H03H 9/706* (2013.01)

(58) Field of Classification Search
CPC ........ H03H 9/08; H03H 9/1007; H03H 9/175; H03H 9/02102; H01L 41/27
(Continued)

(56) References Cited

U.S. PATENT DOCUMENTS

| 7,489,063 B2 * | 2/2009 | Isobe ........................ H03H 3/04 310/312 |
| 7,755,255 B2 * | 7/2010 | Saito ....................... A61B 8/546 310/327 |

(Continued)

FOREIGN PATENT DOCUMENTS

DE          10252828 A1 *  7/2004   ............... H03H 3/02

OTHER PUBLICATIONS

Hassine n. B., et al., "Self heating under RF power in BAW SMR and its predictive 1D thermal model" Frequency Control Symposium. 2009 Joint With the 22nd European Frequency and Time Forum. IEEE International. IEEE. Piscataway. NJ. USA. Apr. 20, 2009 (Apr. 20, 2009). pp. 237-240. XP031492373. ISBN: 978-1-4244-3511-1.

(Continued)

*Primary Examiner* — Dean O Takaoka
(74) *Attorney, Agent, or Firm* — Patterson & Sheridan, L.L.P.

(57) ABSTRACT

The invention relates to a BAW resonator with reduced heat build-up. The heat build-up is reduced by a thermal bridge, which dissipates heat from the electro-acoustically active region to a support substrate, without impairing the acoustics of the resonator.

15 Claims, 4 Drawing Sheets

(51) Int. Cl.
*H03H 3/013* (2006.01)
*H03H 9/17* (2006.01)
*H01L 41/27* (2013.01)
*H03H 9/70* (2006.01)

(58) Field of Classification Search
USPC .......................................................... 333/187
See application file for complete search history.

(56) References Cited

U.S. PATENT DOCUMENTS

| | | |
|---|---|---|
| 9,362,880 B2 * | 6/2016 | Sinha ........................ H03H 3/04 |
| 10,193,523 B2 * | 1/2019 | Jager ................... H03H 9/02015 |
| 2005/0167854 A1 | 8/2005 | Tikka et al. |
| 2007/0052327 A1 * | 3/2007 | Vilander ............ H03H 9/02102 |
| | | 310/343 |
| 2007/0285191 A1 * | 12/2007 | Jacobsen .................. H03H 3/04 |
| | | 333/187 |
| 2008/0312537 A1 | 12/2008 | Hyuga |
| 2009/0261922 A1 | 10/2009 | Umeda |
| 2010/0013573 A1 | 1/2010 | Umeda |
| 2012/0074811 A1 * | 3/2012 | Pang .................... H03H 9/0095 |
| | | 310/317 |
| 2013/0343028 A1 | 12/2013 | Henn |
| 2014/0018126 A1 | 1/2014 | Asai et al. |

OTHER PUBLICATIONS

International Search Report and Written Opinion—PCT/EP2015/076197—ISA/EPO—dated Feb. 2, 2016.

\* cited by examiner

BAW RESONATOR WITH REDUCED HEAT BUILD-UP, HF FILTER COMPRISING BAW RESONATOR, DUPLEXER COMPRISING HF FILTER, AND PRODUCTION METHOD

The invention relates to BAW resonators, the electro-acoustic properties of which are improved by reduced heat build-up during operation. The invention furthermore relates to HF filters or duplexers comprising correspondingly designed resonators and to methods for the production of such a resonator.

BAW resonators (BAW=bulk acoustic wave) comprise a piezoelectric material between two electrode layers. By applying an HF signal, acoustic waves are induced and vice versa. The thickness of the piezoelectric layer substantially corresponds to half of the wavelength $\lambda/2$ of the frequency associated with the HF signal.

Such resonators are used in particular in HF filters and duplexers of mobile communication devices. As a result of a thermal change of a BAW resonator, its acoustic and thus also its electrical properties change.

Accordingly designed filters therefore react to a temperature change by changing the center frequencies and the bandwidths. Since the filters are subject to strict specifications, a temperature change is undesired. There are indeed possibilities of compensating the changes of the electrical properties despite the temperature change. A BAW resonator with reduced heat build-up is however nevertheless desirable in any case.

A possibility for reducing the heat build-up of a BAW resonator consists in enlarging the resonator area. For example, it is possible to cascade a resonator in series. In order to maintain the impedance, each of the two cascaded resonators requires twice the original area so that a quadrupling of the net area requirement results overall.

The task therefore exists to specify a BAW resonator with reduced heat build-up.

This task is solved by the BAW resonator in accordance with the independent claim 1. Dependent claims specify advantageous embodiments of the resonator or their use in filters or duplexers. Methods for the production of BAW resonators with reduced heat build-up are also specified.

The BAW resonator with reduced heat build-up differs from conventional resonators by a thermal bridge conducting heat developing in the electro-acoustic region as a result of dissipative losses to a heat sink, such as a support substrate.

For this purpose, a corresponding resonator comprises an electro-acoustically active region with two electrodes and a piezoelectric layer arranged between them. The resonator furthermore comprises a support substrate as heat sink and an acoustic mirror arranged between the active region and the support substrate. The acoustic mirror comprises at least one layer of low thermal conductivity and one layer of high thermal conductivity. The properties "low" and "high" with respect to the thermal conductivity are to be understood relatively, i.e. the layer of high thermal conductivity has a higher thermal conductivity than the layer of low thermal conductivity. The resonator furthermore comprises a thermal bridge. The layer of low thermal conductivity is suitable for reducing a heat flow from the active region to the support substrate, i.e. heat is generated during operation in the electro-acoustically active region. As a result of the relatively low thermal conductivity of the respective layer, the heat flow from the active region to the support substrate is reduced. An omission of the layer of low thermal conductivity would indeed bring about a good thermal connection of the electro-acoustic region to the support substrate, but the acoustic mirror would then no longer function properly and the resonator would be unusable. In order to reduce the heat build-up despite the insulating layer with the low thermal conductivity, the thermal bridge is present. The thermal bridge is provided to increase the heat flow from the active region to the support substrate.

In other words: Compared to conventional BAW resonators, heat generated in the electro-acoustically active region is offered an additional path of low resistance to the support substrate. With respect to a heat flow from the electro-acoustically active region to the support substrate, a short circuit of least resistance is created.

The thermal bridge itself is however in this case substantially not electro-acoustically or electrically active with respect to the heat conduction. The BAW resonator is therefore at most insignificantly worsened in its electrical and acoustic properties. This is in contrast to the attempt of replacing layers of the mirror of low thermal conductivity by layers of high thermal conductivity. Layers of high and low acoustic impedance are needed in alternating sequence for the mirror. Known material substantially have either a high acoustic impedance and a high thermal conductivity or a low acoustic impedance and a low thermal conductivity. If a layer of low thermal conductivity were replaced by a layer of high thermal conductivity, a layer of low acoustic impedance would at the same time be replaced by a layer of high acoustic impedance, whereby the mirror is significantly worsened in its acoustic properties.

It is possible that the acoustic mirror comprises one or more additional layers of low thermal conductivity in addition to the layer of low thermal conductivity. The same applies to the layer height of high thermal conductivity. The number of layers is in this case substantially determined with respect to its acoustic requirements. In this respect, the following applies: The higher the number of layers the worse in principle the thermal coupling of the electro-acoustically active region to the support substrate, i.e. the more layers the mirror comprises, the higher is the influence of the thermal bridge on the reduction of the heat build-up.

It is in particular possible that the layers of low thermal conductivity have a low acoustic impedance and the layers of high thermal conductivity have a high acoustic impedance.

The layers of low thermal conductivity can in this respect in particular comprise dielectric material, while the layers of high thermal conductivity comprise a metal or consist of a metal or an alloy. In this case, the usual materials, such as silicon dioxide for layers of low acoustic impedance and low thermal conductivity or heavy metals, such as tungsten, for layers of high acoustic impedance and high thermal conductivity, can be used.

It is in particular possible that the thermal bridge has a higher thermal conductivity than the layer of low thermal conductivity. The thermal conductivity of the thermal bridge can in this case be smaller than, equal to, or greater than the thermal conductivity of the layers of high thermal conductivity.

Since the thermal bridge is acoustically substantially not active, the selection of the material of the thermal bridge can take into consideration exclusively the thermal conductivity, while the selection of the material of the layer of high thermal conductivity in the mirror must also take into consideration its acoustic properties.

It is possible that the distance between the thermal bridge and the active region is smaller than the distance between the active region and the support substrate. It is furthermore possible that the distance between the thermal bridge and the support substrate is smaller than the distance between the active region and the support substrate.

The distance between two elements is in this case the length of the line of the shortest connection between these two elements.

That the thermal bridge has a small distance to the active region or to the support substrate allows it to conduct heat well away from the active region and/or toward the support substrate. The thermal conductivity of the thermal bridge itself is in this case relatively high. As a result of the small distance between the thermal bridge and the respective region, a sufficient heat flow is also possible, even if the material between the bridge and the respective region is separated by a material of lower thermal conductivity.

It is preferred that the thermal bridge directly adjoins both the active region and the support substrate and short-circuits the active region and the support substrate with respect to the heat flow.

It is possible that the thermal bridge comprises a region surrounding the active region in the lateral direction.

This means that the electro-acoustically active region is within the region of the thermal bridge. The thermal bridge can in this case maintain a sufficient distance in the lateral direction in order to not impair the acoustics of the resonator. In the vertical direction, the thermal bridge can extend from the layers of the active region downward to the substrate.

If the resonator is arranged on a support substrate by itself or together with other resonators with low heat build-up, e.g. in a ladder-type structure, it is in particular possible that the different layer stacks of the different resonators are arranged next to each other. The surface of the support substrate is in this case generally somewhat larger than the sum of the surfaces of the electro-acoustic regions of the different resonators. This is why around the electro-acoustic regions exist [missing noun], in which can be arranged material of the thermal bridge, which can conduct heat away from different electro-acoustic regions of the resonators to the support substrate.

In this case, the support substrate does not need to be larger than conventional resonators or filters. Without additional negative properties, the heat build-up of the resonators or the filters is improved.

It is alternatively or additionally also possible that the thermal bridge comprises a region that is arranged in at least one layer of low thermal conductivity. This region connects at least one layer of high thermal conductivity with the active region or with the support substrate.

It is alternatively or additionally also possible that the thermal bridge comprises a region that is arranged in at least one layer of low thermal conductivity and combines two layers of high thermal conductivity with one another.

Without impairing the acoustics of the layer stack, e.g. by selecting the respective area of a layer sufficiently small, the layers of low thermal conductivity can, for example, comprise pillar-shaped or cylindrical portions, which short-circuit layers of high thermal conductivity of the stack with respect to a heat flow.

Corresponding regions within the layers of low thermal conductivity can in this case comprise segments that act, for example, as phononic lattice and improve the acoustics of the mirror. In this way, it is, for example, possible to limit lateral vibrations in the mirror to a few or even one single mode. The material of the thermal bridge can be selected accordingly for this purpose, e.g. with respect to its acoustic impedance.

It is in particular possible that one or more accordingly designed BAW resonators are connected in an HF filter and are arranged, for example, on a common support substrate.

Such a filter or individual resonators with reduced heat build-up can be connected in a duplexer, e.g. in a front-end circuit of a mobile communication device.

Segments of different regions of the thermal bridge can in particular form a two- or three-dimensional periodic lattice, such as the aforementioned phononic lattice. The segments of the lattice can be designed in their size, form, and position such that they fulfill the Bragg condition with respect to a frequency of an undesired mode in order to limit the otherwise free propagation of this mode. The segments can, for example, comprise a width of $\lambda/4$ with respect to the undesired mode. The distance of the segments in the horizontal direction can also be $\lambda/4$. In order to simplify the structuring processes, integer multiples, in particular uneven multiples, of the quarter wavelength can also be preferred. The width of the segments and the horizontal distance can be identical or different. For example, the width can be n $\lambda/4$ and the distance m $\lambda/4$ and m>n. It is in particular possible that m is significantly larger, such as 2, 5, 10, 20, or 100 times larger, than n. The larger m is compared to n, the lower is the influence on the main (longitudinal) mode propagating in the vertical direction.

In order to be able to simultaneously trap several undesired modes, such as different lateral modes, the widths and the distances of the segments can be selected differently in the different electro-acoustically active regions and can be adjusted to the different values for $\lambda/4$.

The thermal bridge may comprise different materials. Into consideration come, in particular for the top layer, different modifications of carbon, such as diamond, carbon nanotubes, or graphite, sapphire, ruby, or another modification of an aluminum oxide, silicon (Si), or germanium (Ge). However, other materials, such as oxides of the metals silver (Ag), copper (Cu), gold (Au), potassium (K), molybdenum (Mo), brass, zinc (Zn), magnesium (Mg), tungsten (W), sodium (Na), nickel (Ni), iron (Fe), platinum (Pt), tin (Sn), tantalum (Ta), lead (Pb), or titanium (Ti), or oxidic ceramics with one or more of these metals are also possible.

In layers below the top layer, the metals or alloys mentioned may be contained with these metals in the thermal bridge.

Indeed, the top layer of the thermal bridge may also contain metal. In order to avoid the electrical properties of the resonator, a dielectric material is however preferred in the top layer.

A method for producing a BAW resonator with reduced heat build-up comprises the steps:
  Providing a support substrate,
  Arranging an acoustic mirror with alternating layers of high and low thermal conductivity,
  Structuring an electro-acoustically active region with a piezoelectric layer between two electrode layers on the mirror.

The method furthermore comprises steps for structuring a thermal bridge that is provided and suitable for transferring heat from the active region to the support substrate.

The steps for forming the thermal bridge can in this case substantially comprise the usual steps for layer deposition and/or structuring, such as lithography processes with resist layers and exposure processes.

It is possible that the method is carried out such that the thermal bridge comprises a region that comprises a material of higher thermal conductivity than the layers of low thermal conductivity. The thermal bridge is in this case structured such that at least one of its regions laterally surrounds the active region.

In this way, the region of the thermal bridge can form a frame structure around the electro-acoustically active region and can conduct heat laterally past the mirror from the active region to the support substrate.

It is possible that the method comprises steps, during which a region of the thermal bridge is structured that comprises a material of higher thermal conductivity than the layers of low thermal conductivity and that is structured within the layers of low thermal conductivity.

This region within the layer of low thermal conductivity may in this case comprise an array of periodically arranged fields that are suitable for selecting the desired modes and thereby improving the coupling of the resonator.

It is in particular possible that the methods for producing the resonators comprise lithography processes for depositing the material of the thermal bridge, e.g. in the layers of low thermal conductivity or in a frame structure around the mirror.

The BAW resonator with reduced heat build-up or production methods in this respect are explained in more detail below with reference to the schematic, non-limiting figures.

BRIEF DESCRIPTION OF THE DRAWINGS

FIG. 1 illustrates the function of the thermal bridge. In a heat source WQ, such as an electro-acoustically active region during the operation of a BAW resonator, heat is generated, for example, by dissipative losses. As heat sink WS serves, for example, the support substrate of a BAW resonator. Between the heat source WQ and the heat sink WS is arranged the acoustic mirror, which is designed in an alternating sequence of layers with high thermal conductivity WL and substantially heat-insulating layers WI. The thermal conductivity between the heat source WQ and the heat sink WS is in particular limited by the heat-insulating layers WI. In order to maintain the heat conductivity between the heat source WQ and the heat sink WS, regions of a thermal bridge WB are provided, which create a short circuit between the heat source WQ and the heat sink WS with respect to a heat flow. The regions of the thermal bridge WB are in this case arranged and designed such that the acoustics between the electro-acoustic region (the heat source) and the heat sink (the support substrate) are not impaired. In this way, a BAW resonator BAWR with good electrical and acoustic properties and at the same time low heat build-up as a result of improved thermal management is obtained.

FIG. 2 shows the top view of an HF filter, which comprises a plurality of BAW resonators BAWR, which are arranged on a support substrate TS. The electro-acoustically active regions and the regions of the electrical contacting are in this case marked in black. The other regions (marked shaded) can serve to accommodate one or more thermal bridges WB, without impairing the acoustics of the resonators.

FIG. 3 shows a horizontal cross section through a layer stack of a BAW resonator BAWR. The layer stack is arranged on a support substrate TS, which serves as heat sink WS. The support substrate can, for example, comprise silicon, such as crystalline silicon, which provides a sufficiently high thermal conductivity in order to absorb heat from the electro-acoustic region EAB and to conduct it away to the environment.

The electro-acoustically active region EAB comprises a lower electrode EL and an upper electrode EL and a piezoelectric material between them. Below the lower electrode EL is arranged a layer stack of alternately arranged layers of low thermal conductivity WI and high thermal conductivity WL. The materials of the mirror are selected predominantly with respect to the acoustics of the layer stack. The piezoelectric material between the electrodes EL has a higher thermal conductivity than the material of the layers of low thermal conductivity WI. The material of the piezoelectric layer can thus simultaneously serve as material of the thermal bridge WB and conduct heat away from the electro-acoustic region EAB to the support substrate TS on a direct path. The piezoelectric layer is in this case expanded such that it completely covers the stack of the mirror layers and connects the electro-acoustic region directly to the support substrate TS without impairing the acoustics of the resonator BAWR.

Figure 1:
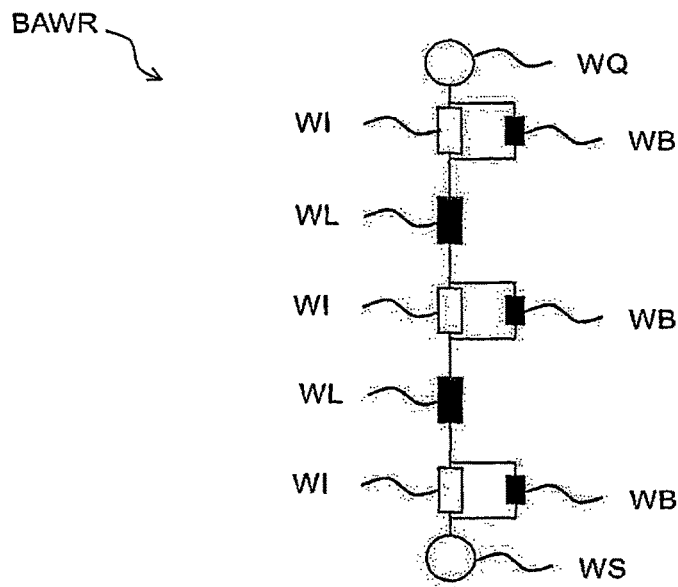
FIG. 1: the mode of operation of the thermal bridge as short circuit with respect to the heat conduction from a heat source to a heat sink.
Figure 2:
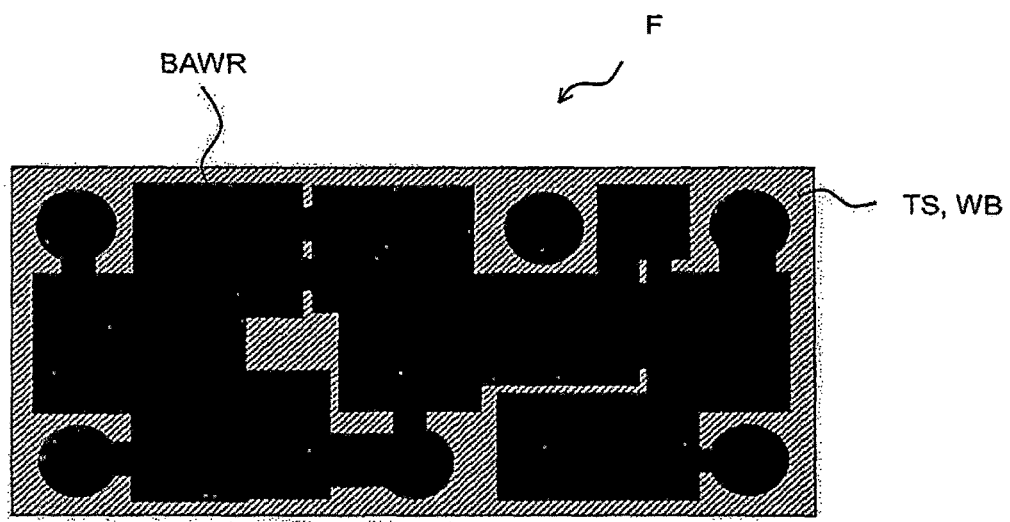
FIG. 2: the arrangement of different BAW resonators on a support substrate.
Figure 3:
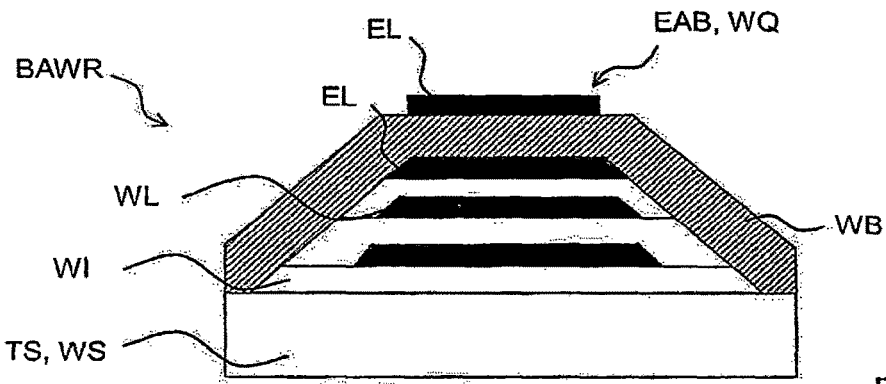
FIG. 3: a cross section through a possible layer stack of a resonator.
Figure 4:
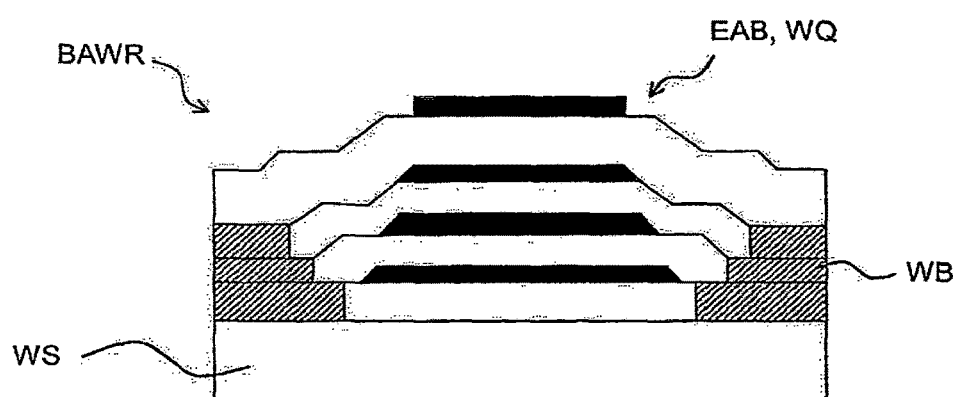
FIG. 4: a cross section through a layer stack, in which the thermal bridge is formed by a frame-shaped structure.

FIG. 4 shows an embodiment, in which two upper electrode layers and a piezoelectric layer arranged between them form the electro-acoustic region EAB analogously to the embodiment of FIG. 3. Below them are arranged mirror layers with alternating heat conductivity and accordingly alternating acoustic impedance. The layer stack of the BAN resonator BAWR is in turn arranged on a support substrate as heat sink WS. In addition thereto and between the support substrate or the heat sink WS and the material of the piezoelectric layer is formed a frame structure made of layers of relatively high thermal conductivity, said layers flanking the layer stack of the mirror These layers form the thermal bridge, which conducts heat away from the electro-acoustic region EAB via material of the piezoelectric layer to the heat sink WS.

Compared to the layer stack of FIG. 3, the thermal bridge WB is in this case better acoustically coupled.

Figure 5:
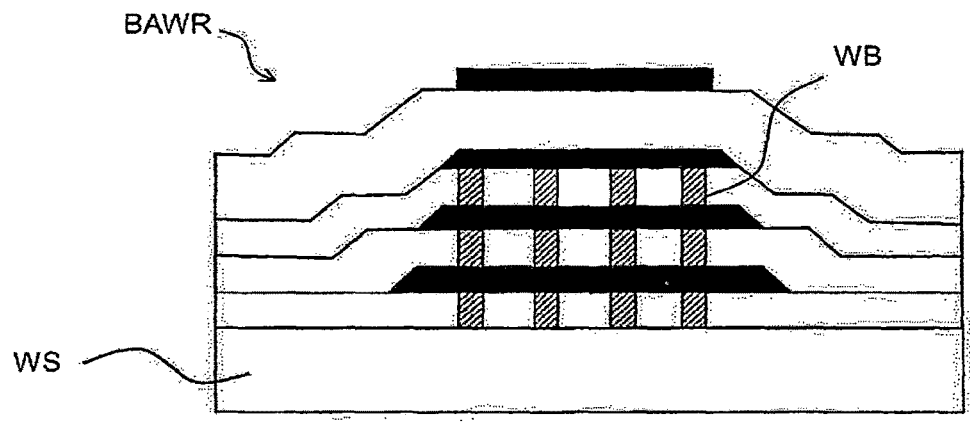
FIG. 5: a cross section through a layer stack, in which the thermal bridge comprises a region with segments of high thermal conductivity between mirror layers of high thermal conductivity.

FIG. 5 shows an embodiment, in which the thermal bridge WB comprises a region in the layers of low thermal conductivity. In this case, the region comprises a plurality of individual segments in the different layers, which, as heat feedthrough, can transfer heat between the individual layers of high thermal conductivity from the electro-acoustic region to the heat sink. The segments of the region of the thermal bridge WB are in this case in principle arranged in regions of the resonator, in which acoustic waves propagate, even if downward with decreasing intensity. However, even an improvement of the acoustics and/or in particular of the coupling can be obtained if the segments are dimensioned accordingly and selected with respect to their acoustic impedance. The segments of the thermal bridge WB can thus form a phononic lattice and reduce or prevent the formation of undesired vibration modes. Unavoidable undesired modes of reduced intensity can be trapped and reduced in their effects.

Figure 6:
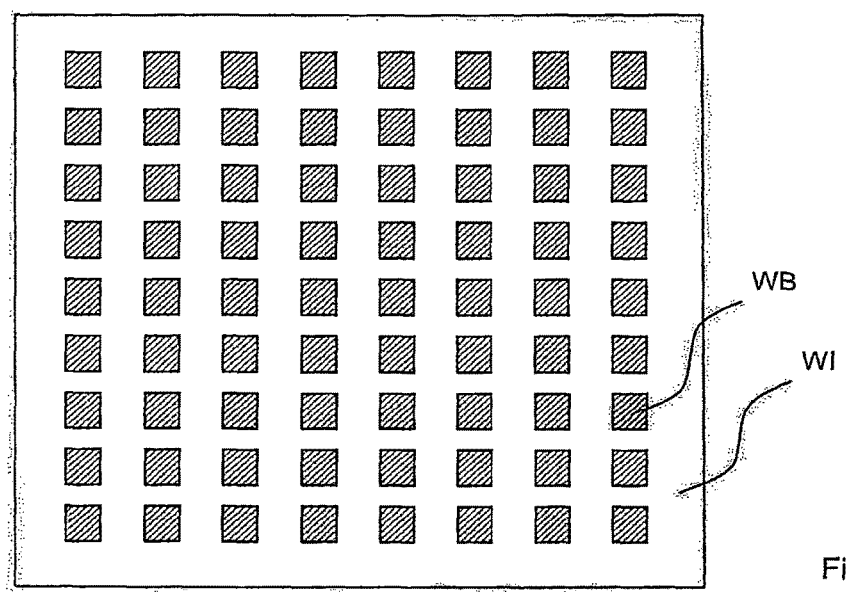
FIG. 6: a horizontal cross section through a layer of low thermal conductivity, in which segments of the thermal bridge are arranged.

FIG. 6 shows a cross section in the horizontal direction through a layer of low thermal conductivity WI, in which segments of the thermal bridge WB are arranged in a lattice structure and form a phononic lattice. The cross section of the individual segments can in this case be square, rectangular, elliptical, circular, or comprise a more complex structure, such as different polygonal shapes. Preferably, the shape of the cross section and the area of the cross section are constant in the vertical direction, which makes possible a simplified production method.

Figure 7:
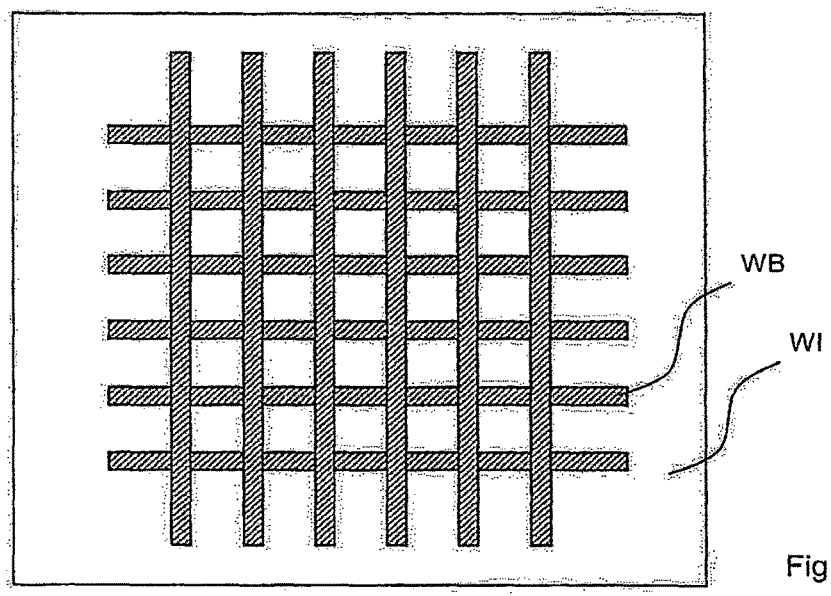
FIG. 7: a cross section in the horizontal direction through a layer of low thermal conductivity, in which segments of the thermal bridge are arranged in the shape of strips.

FIG. 7 shows another possibility of arranging segments of the thermal bridge WB in the layers of low thermal conductivity WI. Accordingly, the segments are arranged as strips crossing each other. Heat can thus be easily transferred not only in the vertical but also in the horizontal direction, which facilitates heat conduction if the heat development in the electro-acoustic region is inhomogeneous.

Figure 8:
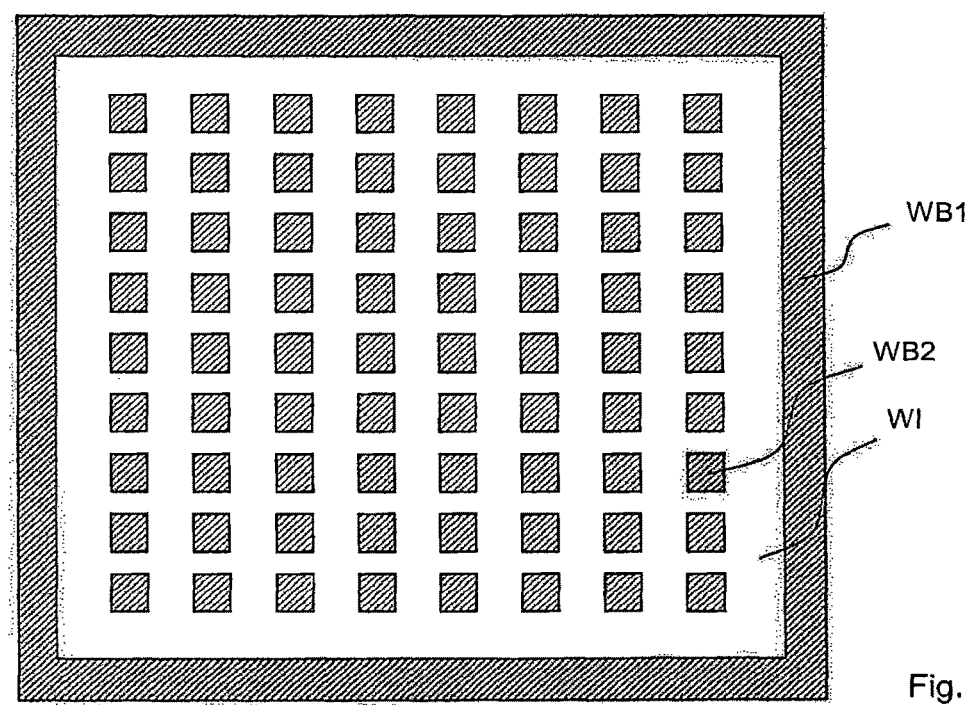
FIG. 8: a cross section in the horizontal direction through a layer of low thermal conductivity, wherein the thermal bridge comprises on the one hand a region with segments within the layer of low thermal conductivity and on the other hand a frame surrounding the layer of low thermal conductivity.

FIG. 8 shows a cross section through a layer of low thermal conductivity, in which the thermal bridge comprises a first region WB1, which is arranged in the shape of a frame around the resonator stack. An additional region WB2 comprises segments within the layer of low conductivity.

It is thus clear that the thermal bridge is not limited to individual regions. The individually described regions of a thermal bridge may be combined and thereby be a thermal bridge with further increased conductivity.

LIST OF REFERENCE SYMBOLS

BAWR: BAW resonator
EAB: electro-acoustic region
EL: Electrode
F: HF filter
TS: Support substrate
WB: Thermal bridge
WB1: First region of the thermal bridge
WB2: Additional region of the thermal bridge
WI: Layer of low thermal conductivity, heat-insulating layer
WL: Layer of high thermal conductivity
WQ: Heat source

The invention claimed is:

1. A bulk acoustic wave resonator (BAWR) comprising:
   an electro-acoustically active region with two electrodes and a piezoelectric layer arranged between them;
   a support substrate;
   an acoustic mirror arranged between the electro-acoustically active region and the support substrate and comprising a layer of low thermal conductivity and a layer of high thermal conductivity; and
   a thermal bridge coupled to the support substrate and the electro-acoustically active region;
   wherein the layer of low thermal conductivity is suitable for reducing a heat flow from the electro-acoustically active region to the support substrate, and
   wherein the thermal bridge is provided to increase the heat flow from the electro-acoustically active region to the support substrate.

2. The BAWR according to claim 1, wherein the acoustic mirror comprises layers of low thermal conductivity and layers of high thermal conductivity.

3. The BAWR according to claim 2, wherein the layers of low thermal conductivity have a low acoustic impedance and the layers of high thermal conductivity have a high acoustic impedance.

4. The BAWR according to claim 2, wherein the layers of low thermal conductivity comprise a dielectric material and the layers of high thermal conductivity comprise a metal.

5. The BAWR according to claim 1, wherein the thermal bridge has a higher thermal conductivity than the layer of low thermal conductivity.

6. The BAWR according to claim 1, wherein:
   the distance between the thermal bridge and the active region is smaller than the distance between the electro-acoustically active region and the support substrate, and
   the distance between the thermal bridge and the support substrate is smaller than the distance between the electro-acoustically active region and the support substrate.

7. The BAWR according to claim 1, wherein the thermal bridge comprises a region surrounding the electro-acoustically active region in the lateral direction.

8. The BAWR according to claim 1, wherein the thermal bridge comprises a region, arranged in at least one layer of low thermal conductivity and connecting at least one layer of high thermal conductivity to the electro-acoustically active region or to the support substrate.

9. The BAWR according to claim 2, wherein the thermal bridge comprises a region arranged in at least one layer of low thermal conductivity and connecting two layers of high thermal conductivity to each other.

10. A high frequency filter comprising a bulk acoustic wave resonator (BAWR) according to claim 1.

11. A duplexer comprising a high frequency filter having a bulk acoustic wave resonator (BAWR) according to claim 1.

12. A method for producing a bulk acoustic wave resonator (BAWR), comprising:
    forming an acoustic mirror with alternating layers of high and low thermal conductivity on a support substrate,
    forming an electro-acoustically active region with a piezoelectric layer between two electrode layers on the acoustic mirror, and
    forming a thermal bridge, which is configured to transfer heat from the electro-acoustically active region to the support substrate, coupled to the support substrate and the electro-acoustically active region.

13. The method according to claim 12, wherein the thermal bridge comprises a region comprising a material of higher thermal conductivity than the layers of low thermal conductivity and laterally surrounding the electro-acoustically active region.

14. The method according to claim 12, wherein the thermal bridge comprises a region comprising a material of higher thermal conductivity than the layers of low thermal conductivity and being structured within the layers of low thermal conductivity.

15. The method according to claim 14, wherein forming the thermal bridge comprises depositing, via lithography processes, material of the thermal bridge in the layers of low thermal conductivity.

* * * * *